United States Patent
Zhang et al.

(10) Patent No.: US 11,217,473 B1
(45) Date of Patent: Jan. 4, 2022

(54) PEELING DEVICE

(71) Applicant: TRIPLE WIN TECHNOLOGY (SHENZHEN) CO. LTD., Shenzhen (CN)

(72) Inventors: Chong Zhang, Shenzhen (CN); Yen-Sheng Lin, New Taipei (TW); Jun Wan, Shenzhen (CN)

(73) Assignee: TRIPLE WIN TECHNOLOGY (SHENZHEN) CO. LTD., Shenzhen (CN)

( * ) Notice: Subject to any disclaimer, the term of this patent is extended or adjusted under 35 U.S.C. 154(b) by 0 days.

(21) Appl. No.: 16/951,857

(22) Filed: Nov. 18, 2020

(30) Foreign Application Priority Data

Aug. 20, 2020 (CN) .......................... 202010845894.X

(51) Int. Cl.
*B32B 43/00* (2006.01)
*H01L 21/683* (2006.01)
*B32B 38/10* (2006.01)

(52) U.S. Cl.
CPC ........ *H01L 21/6836* (2013.01); *B32B 43/006* (2013.01); *H01L 21/6838* (2013.01); *B32B 38/10* (2013.01); *H01L 2221/68386* (2013.01); *Y10T 156/1168* (2015.01); *Y10T 156/1195* (2015.01); *Y10T 156/1978* (2015.01); *Y10T 156/1994* (2015.01)

(58) Field of Classification Search
CPC . B32B 38/10; B32B 43/006; Y10T 156/1168; Y10T 156/1195; Y10T 156/1978; Y10T 156/1994
See application file for complete search history.

(56) References Cited

U.S. PATENT DOCUMENTS

| | | | | |
|---|---|---|---|---|
| 5,645,680 | A * | 7/1997 | Rietheimer | B65C 9/1876 156/447 |
| 6,349,756 | B1 * | 2/2002 | Brough | B29C 63/0013 156/247 |
| 7,416,628 | B2 * | 8/2008 | Carver | B65C 9/0006 156/249 |
| 8,500,937 | B2 * | 8/2013 | Kitada | B32B 38/10 156/247 |
| 2003/0070750 | A1 * | 4/2003 | Moore | B65H 20/24 156/249 |
| 2003/0098131 | A1 * | 5/2003 | Hayasaka | B32B 38/10 156/763 |

(Continued)

*Primary Examiner* — Mark A Osele
*Assistant Examiner* — Nickolas R Harm
(74) *Attorney, Agent, or Firm* — ScienBiziP, P.C.

(57) ABSTRACT

A peeling device includes a rolling mechanism, a peeling mechanism, and a suction mechanism. The rolling mechanism includes a feeding wheel and a receiving wheel. At least one of the feeding wheel and the receiving wheel is configured to rotate. The peeling mechanism includes a peeling plate including a first surface and a side surface. The suction mechanism includes a support table and a rotary suction cup. A carrier tape is transmitted in sequence around the feeding wheel, the first surface, the side surface, and the receiving wheel. The peeling plate peels the material from the carrier tape at a junction of the first surface and the side surface. The support table holds the material peeled from the carrier tape. The rotary suction cup is used to suck the material from the support table and move the material to a next processing area.

14 Claims, 4 Drawing Sheets

(56) References Cited

U.S. PATENT DOCUMENTS

| | | | |
|---|---|---|---|
| 2005/0034577 A1* | 2/2005 | Au | H01L 21/67132 83/13 |
| 2006/0185796 A1* | 8/2006 | Hayasaka | B65C 9/36 156/361 |
| 2009/0199950 A1* | 8/2009 | Kitada | B32B 41/00 156/64 |
| 2013/0059106 A1* | 3/2013 | Bayzelon | B32B 38/14 428/41.8 |
| 2013/0126100 A1* | 5/2013 | Fujita | B65H 37/002 156/719 |

* cited by examiner

PEELING DEVICE

FIELD

The subject matter herein generally relates to a peeling device for peeling a material from a carrier tape.

BACKGROUND

In order to facilitate transportation or storage, small, low-strength electronic components (such as mobile phone camera modules, chips, etc.) are generally attached to a carrier tape at intervals. A vacuum suction nozzle is used to remove the electronic components from the carrier tape for processing.

However, if an adhesive force between the carrier tape and the electronic component is too strong, the vacuum suction nozzle cannot peel the electronic component from the carrier tape, and may even suck the carrier tape together with the electronic component, which reduced production efficiency.

BRIEF DESCRIPTION OF THE DRAWINGS

Implementations of the present disclosure will now be described, by way of embodiments, with reference to the attached figures.

DETAILED DESCRIPTION

Figure 1:
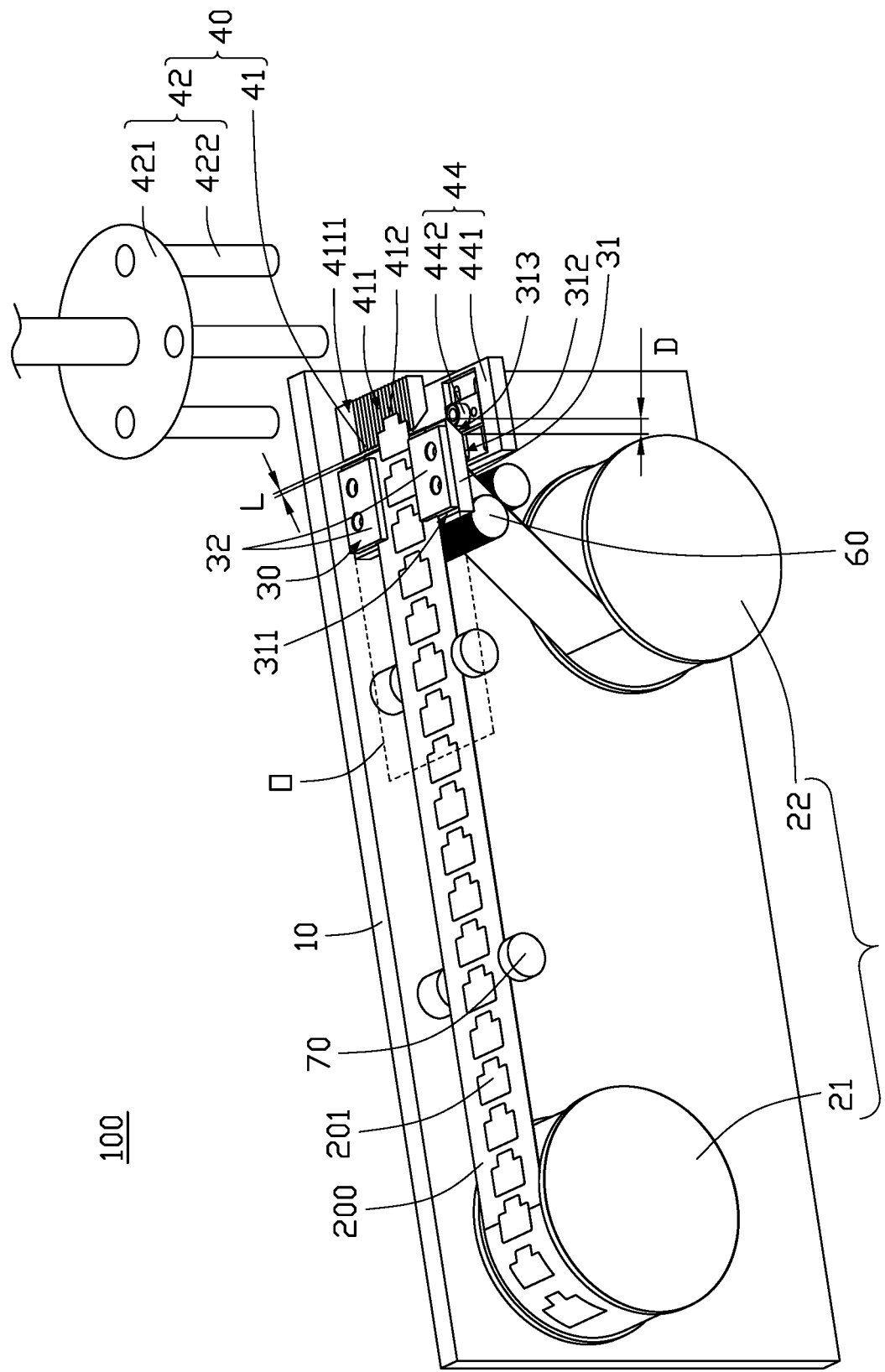
FIG. 1 is a schematic perspective diagram of a peeling device according to an embodiment.

It will be appreciated that for simplicity and clarity of illustration, where appropriate, reference numerals have been repeated among the different figures to indicate corresponding or analogous elements. Additionally, numerous specific details are set forth in order to provide a thorough understanding of the embodiments described herein. However, it will be understood by those of ordinary skill in the art that the embodiments described herein can be practiced without these specific details. In other instances, methods, procedures and components have not been described in detail so as not to obscure the related relevant feature being described. The drawings are not necessarily to scale and the proportions of certain parts may be exaggerated to better illustrate details and features. The description is not to be considered as limiting the scope of the embodiments described herein.

Several definitions that apply throughout this disclosure will now be presented.

The term "coupled" is defined as connected, whether directly or indirectly through intervening components, and is not necessarily limited to physical connections. The connection can be such that the objects are permanently connected or releasably connected. The term "substantially" is defined to be essentially conforming to the particular dimension, shape, or another word that "substantially" modifies, such that the component need not be exact. For example, "substantially cylindrical" means that the object resembles a cylinder, but can have one or more deviations from a true cylinder. The term "comprising" means "including, but not necessarily limited to"; it specifically indicates open-ended inclusion or membership in a so-described combination, group, series, and the like.

Figure 2:
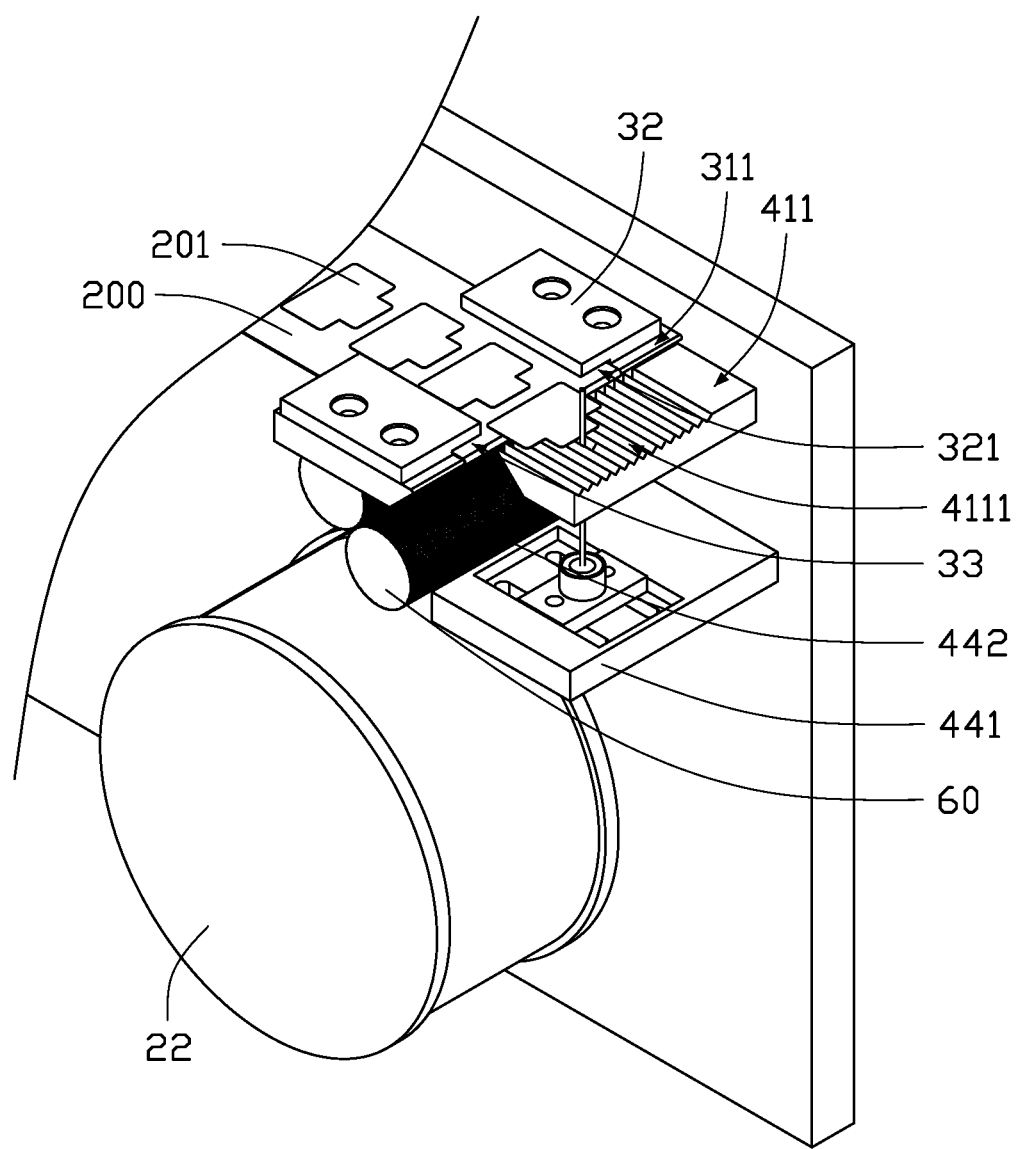
FIG. 2 is a partially enlarged view of the peeling device shown in FIG. 1.

FIGS. 1 and 2 show an embodiment of a peeling device 100 for peeling a material 201 (such as a conductive patch) attached to a carrier tape 200 and transferring the material 201 to a next processing area. The peeling device 100 includes a fixed base 10, a rolling mechanism 20 fixed on the fixed base 10, a peeling mechanism 30, a suction mechanism 40, and a driving mechanism (not shown).

The rolling mechanism 20 includes a feeding wheel 21 and a receiving wheel 22 that is coupled to the feeding wheel 21 in transmission. The driving mechanism (not shown) drives at least one of the feeding wheel 21 and the receiving wheel 22 to rotate. The feeding wheel 21 is used to convey the carrier tape 200 with the material 201, and the receiving wheel 22 is used to rewind the carrier tape 200 after peeling off the material 201.

The peeling mechanism 30 includes a peeling plate 31 including a first surface 311 and a side surface 313 coupled to the first surface 311. The carrier tape 200 is transmitted in sequence around the feeding wheel 21, the first surface 311, the side surface 313, and the receiving wheel 22 along a transmission direction of the carrier tape 200, and the peeling plate 31 is used to peel the material 201 from the carrier tape 200 at a junction of the first surface 311 and the side surface 313.

The suction mechanism 40 includes a support table 41 and at least one rotary suction cup 42. The support table 41 is located on a side of the peeling plate 31 away from the feeding wheel 21 and used for temporarily holding the material 201 that is peeled off the carrier belt 200. The rotary suction cup 42 is used to suck the material 201 from the support table 41 and move the material 201 to the next processing area. By providing the peeling plate 31, it is possible to ensure that the material 201 is peeled from the carrier tape 200, thereby improving the efficiency of moving the material 201 to the next processing area.

In one embodiment, the peeling plate 31 further includes a second surface 312 opposite to the first surface 311, and the side surface 313 is coupled between the first surface 311 and the second surface 312. A projection of the second surface 312 on the first surface 311 is smaller than a surface area of the first surface 311, so that the side surface 313 and the first surface 311 form an acute angle. The carrier tape 200 transmitted along the first surface 311 and the side surface 313 causes the material 201 to peel off at the junction of the first surface 311 and the side surface 313. By changing the angle between the first surface 311 and the side surface 313, the material 201 can be peeled from the carrier tape 200 according to an adhesive force between the material 201 and the carrier tape 200. For example, when the adhesive force between the material 201 and the carrier tape 200 is strong, the angle between the first surface 311 and the side surface 313 can be made sharper, and when the adhesive force between the material 201 and the carrier tape 200 is weak, the angle between the first surface 311 and the side surface 313 can be made larger.

In one embodiment, the support table 41 includes a third surface 411 substantially flush with the first surface 311. The third surface 411 defines a plurality of grooves 4111. The grooves 4111 are provided to reduce a contact area between the material 201 and the support table 41, so as to prevent the material 201 from adhering too tightly to the support table 41, so that the rotary suction cup 42 can suck the material 201 from the support table 41.

In one embodiment, a distance L between the support table 41 and the peeling plate 31 is smaller than a size of the material 201, so that the material 201 does not fall from the edge of the support table 41.

In one embodiment, the peeling mechanism 30 further includes two limiting blocks 32 respectively arranged on opposite sides of the peeling plate 31. Each limiting block 32 includes a stepped portion 321, and the two stepped portions 321 are oppositely arranged. The two stepped portions 321 and the first surface 311 jointly enclose a chute 33, and the carrier belt 200 is accommodated in the chute 33. By setting the limiting blocks 32, a position of the carrier tape 200 on the peeling plate 31 will not shift, so as to ensure that the materials 201 all enter the same position of the support table 41.

In one embodiment, an extension direction of the grooves 4111 is the same as an extension direction of the chute 33.

In one embodiment, the suction mechanism 40 further includes a sensing element 44 and a controller (not shown), and the rotary suction cup 42 includes a turntable 421 and a plurality of vacuum suction nozzles 422. The sensing element 44 includes a fixing base 441 and a sensor 442 (such as a photoelectric switch) coupled to the fixing base 441. The support table 41 defines an opening 412 at a position corresponding to the sensor 442, and the controller is electrically coupled to the sensor 442 and the rotary suction cup 42.

Figure 3:
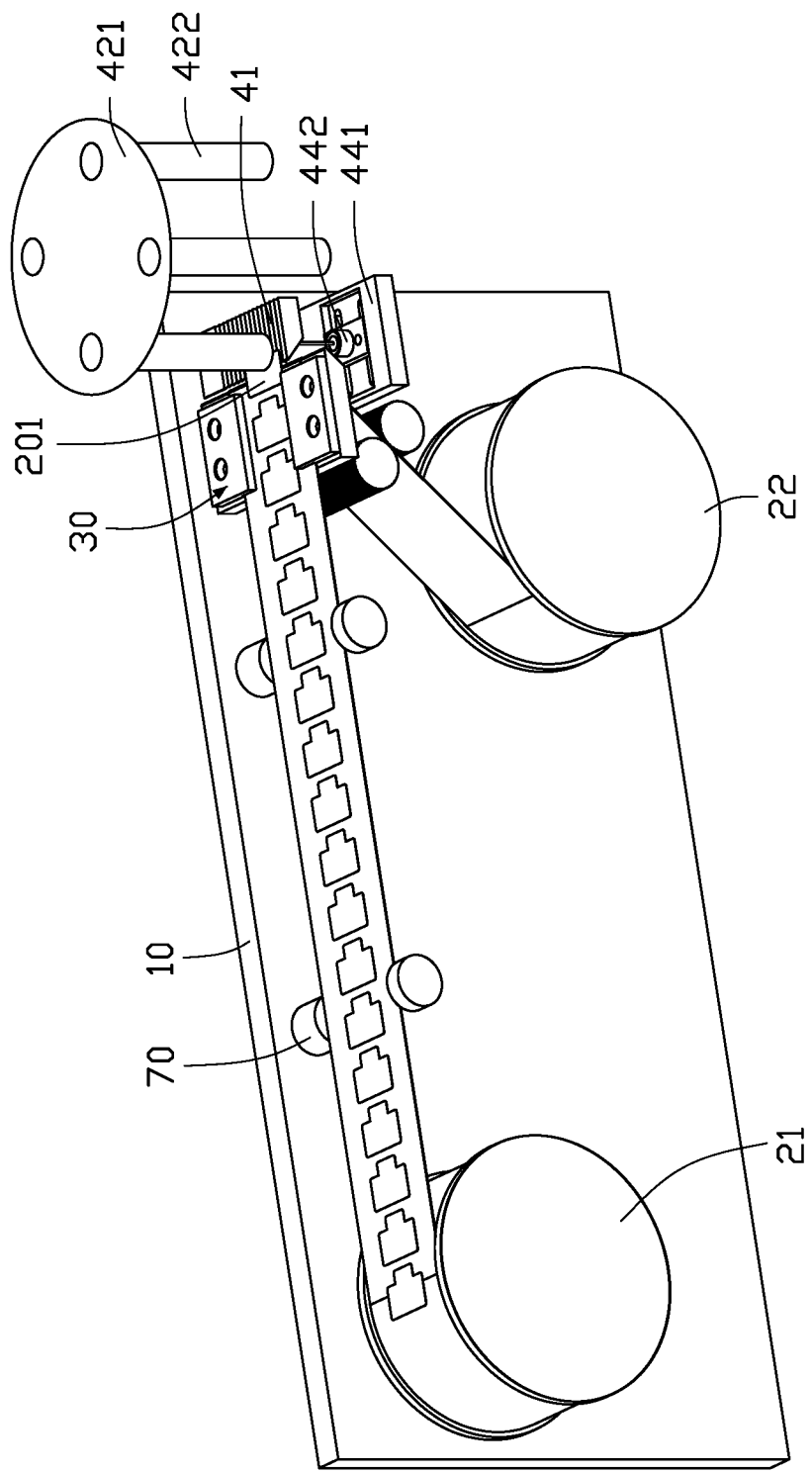
FIG. 3 is a schematic diagram of the peeling device shown in FIG. 1 before a suction mechanism sucks a material.

In operation, referring to FIGS. 1-3, the material 201 peeled from the carrier tape 200 slides from the peeling plate 31 onto the support table 41 and covers the opening 412. At this time, the sensor 442 emits an incident light signal, which passes through the opening 412 and irradiates the material 201. The material 201 reflects the light signal to the sensor 442, and the sensor 442 determines that the material 201 is located on the support table 41.

Figure 4:
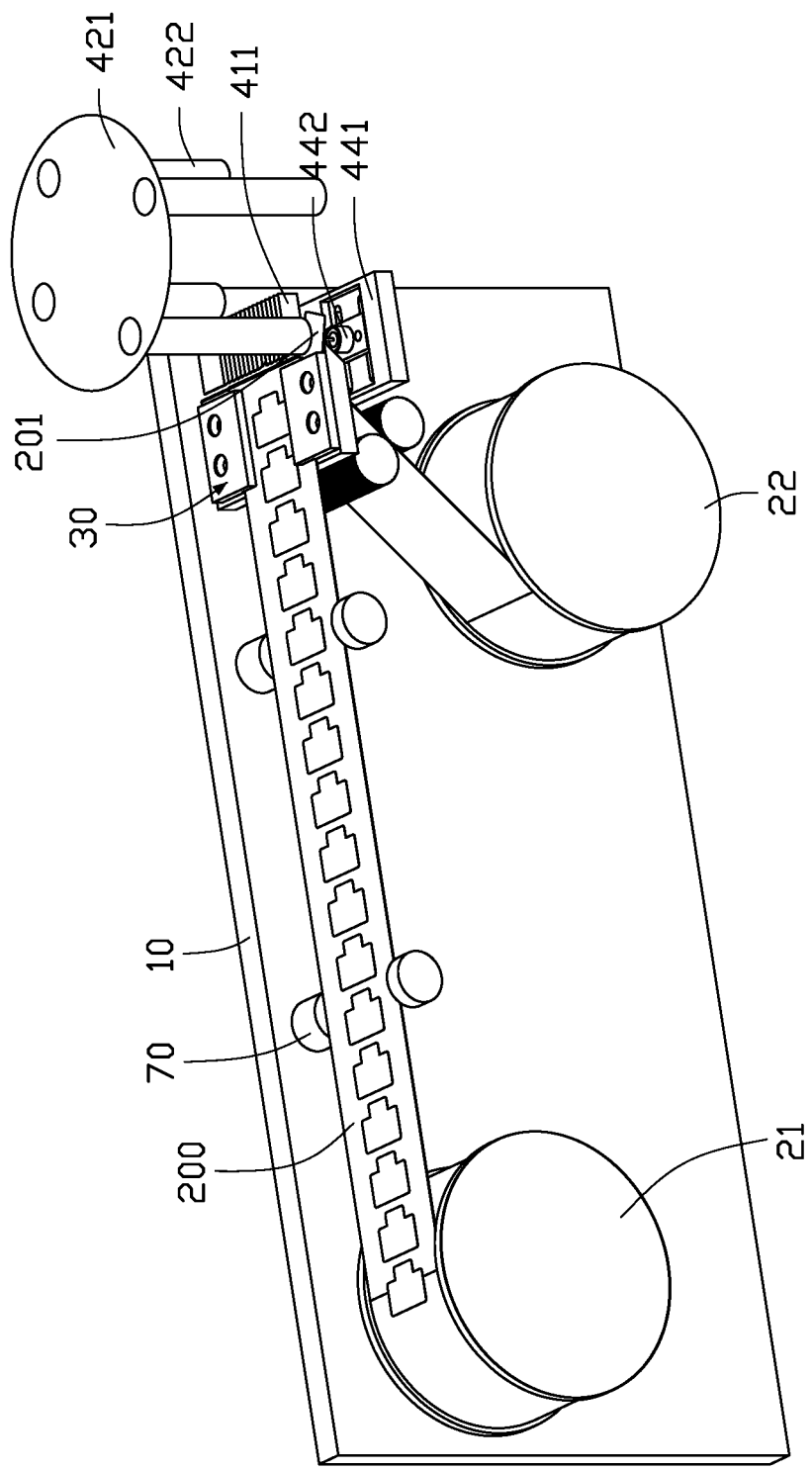
FIG. 4 is a schematic diagram of the peeling device shown in FIG. 1 showing the suction mechanism sucking the material.

Referring to FIG. 3 and FIG. 4, the controller obtains a determination result from the sensor 442 and controls the turntable 421 to rotate until the vacuum suction nozzle 422 abuts the material 201.

Then, the vacuum suction nozzle 422 starts to suck air, so that the material 201 is sucked by the vacuum suction nozzle 422 and adhered to the vacuum suction nozzle 422.

Then, the controller controls the turntable 421 to rotate again until the material 201 is above the next processing area, the vacuum suction nozzle 422 stops sucking air, and the material 201 falls off the vacuum suction nozzle 422 into the next processing area.

If the material 201 is not located on the support table 41, the sensor 442 cannot sense the reflected light, thereby determining that the material 201 is not located on the support table 41. After the controller obtains the determination result from the sensor 442, the controller will not control the turntable 421 to rotate.

In one embodiment, the sensor 442 can be movably coupled to the fixing seat 441, and the opening 412 extends along a movement direction of the sensor 442. By adjusting the position of the sensor 442, different models or sizes of the material 201 can be applied.

In one embodiment, the peeling device 100 further includes a pair of driving wheels 60 fixed on the fixed base 10, and the driving wheels 60 are arranged on a side of the peeling plate 31 adjacent to the feeding wheel 21. The carrier tape 200 is located between the driving wheels 60, and the driving wheels 60 are used to assist in pulling the carrier tape 200 to prevent the carrier tape 200 from jamming.

In one embodiment, the driving wheels 60 are driven by a linear motor. Compared with a stepper motor, the linear motor has no accumulated error, which is beneficial to accurately control the movement speed and position of the carrier belt.

In one embodiment, the peeling device 100 further includes a plurality of guide rollers 70 fixed on the fixed base 10 at intervals. The guide rollers 70 are arranged between the feeding wheel 21 and the peeling plate 31. The guide rollers 70 are used to limit a movement direction of the carrier tape 200, so that the position of the carrier tape 200 before entering the peeling plate 31 is correct.

The embodiments shown and described above are only examples. Even though numerous characteristics and advantages of the present technology have been set forth in the foregoing description, together with details of the structure and function of the present disclosure, the disclosure is illustrative only, and changes may be made in the detail, including in matters of shape, size and arrangement of the parts within the principles of the present disclosure up to, and including, the full extent established by the broad general meaning of the terms used in the claims.

The invention claimed is:

1. A peeling device for peeling a material from a carrier tape, the peeling device comprising:
   a fixed base;
   a rolling mechanism fixed on the fixed base;
   a peeling mechanism fixed on the fixed base; and
   a suction mechanism fixed on the fixed base; wherein:
   the rolling mechanism comprises a feeding wheel and a receiving wheel, at least one of the feeding wheel and the receiving wheel configured to be driven to rotate;
   the peeling mechanism comprises a peeling plate comprising a first surface and a side surface coupled to the first surface;
   the carrier tape is transmitted in sequence around the feeding wheel, the first surface, the side surface, and the receiving wheel along a transmission direction of the carrier tape, and the peeling plate is used to peel the material from the carrier tape at a junction of the first surface and the side surface;
   the suction mechanism comprises a support table and at least one rotary suction cup;
   the support table is located on a side of the peeling plate away from the feeding wheel;
   the support table is configured to hold the material that has been peeled from the carrier tape;
   the at least one rotary suction cup is used to suck the material from the support table and move the material to a next processing area;
   the peeling mechanism further comprises two limiting blocks respectively arranged on opposite sides of the peeling plate;
   each limiting block comprises a stepped portion, and the two stepped portions are oppositely arranged; and
   the two stepped portions and the first surface jointly enclose a chute, and the carrier belt is accommodated in the chute.

2. The peeling device of claim 1, wherein:
   the peeling plate further comprises a second surface opposite to the first surface;
      the side surface is coupled between the first surface and the second surface;
      a projection of the second surface on the first surface is smaller than a surface area of the first surface; and
      the side surface and the first surface form an acute angle.

3. The peeling device of claim 1, wherein:
the support table comprises a third surface flush with the first surface; and
the third surface defines a plurality of grooves.

4. The peeling device of claim 1, wherein:
the suction mechanism further comprises a sensing element;
the at least one rotary suction cup comprises a rotary turntable and a plurality of vacuum suction nozzles located on one side of the rotary turntable;
the sensing element comprises a fixing base and a sensor located on the fixing base; and
the support table defines an opening, the opening is disposed above the sensor and corresponding to the sensor.

5. The peeling device of claim 4, wherein:
the sensor is movably coupled to the fixing base; and
the opening extends along a movement direction of the sensor.

6. The peeling device of claim 1, further comprising a pair of driving wheels fixed on the fixed base, wherein:
the driving wheels are arranged on a side of the peeling plate adjacent to the feeding wheel;
the carrier tape is located between the driving wheels; and
the driving wheels are used to pull the carrier tape.

7. The peeling device of claim 1, further comprising a plurality of guide rollers fixed on the fixed base at intervals, wherein:
the guide rollers are arranged between the feeding wheel and the peeling plate; and
the guide rollers are used to limit a movement direction of the carrier tape.

8. A peeling device comprising:
a fixed base;
a rolling mechanism comprising a feeding wheel and a receiving wheel, at least one of the feeding wheel and the receiving wheel configured to be driven to rotate;
a peeling mechanism comprising a peeling plate comprising a first surface and a side surface coupled to the first surface, the first surface and the side surface forming an acute angle; and
a suction mechanism comprising a support table and at least one rotary suction cup; wherein:
a carrier tape is transmitted in sequence around the feeding wheel, the first surface, the side surface, and the receiving wheel;
the peeling plate is used to peel the material from the carrier tape at a junction of the first surface and the side surface;
the support table is configured to hold the material that has been peeled from the carrier tape; and
the at least one rotary suction cup is used to suck the material from the support table and move the material to a next processing area;
the peeling mechanism further comprises two limiting blocks respectively arranged on opposite sides of the peeling plate;
each limiting block comprises a stepped portion, and the two stepped portions are oppositely arranged; and
the two stepped portions and the first surface jointly enclose a chute, and the carrier belt is accommodated in the chute.

9. The peeling device of claim 8, wherein:
the peeling plate further comprises a second surface opposite to the first surface;
the side surface is coupled between the first surface and the second surface; and
a projection of the second surface on the first surface is smaller than a surface area of the first surface.

10. The peeling device of claim 9, wherein:
the support table comprises a third surface flush with the first surface; and
the third surface defines a plurality of grooves.

11. The peeling device of claim 8, wherein:
the suction mechanism further comprises a sensing element;
the at least one rotary suction cup comprises a rotary turntable and a plurality of vacuum suction nozzles located on one side of the rotary turntable;
the sensing element comprises a fixing base and a sensor located on the fixing base; and
the support table defines an opening, the opening is disposed above the sensor and corresponding to the sensor.

12. The peeling device of claim 11, wherein:
the sensor is movably coupled to the fixing base; and
the opening extends along a movement direction of the sensor.

13. The peeling device of claim 12, further comprising a pair of driving wheels fixed on the fixed base, wherein:
the driving wheels are arranged on a side of the peeling plate adjacent to the feeding wheel;
the carrier tape is located between the driving wheels; and
the driving wheels are used to pull the carrier tape.

14. The peeling device of claim 13, further comprising a plurality of guide rollers fixed on the fixed base at intervals, wherein:
the guide rollers are arranged between the feeding wheel and the peeling plate; and
the guide rollers are used to limit a movement direction of the carrier tape.

* * * * *